United States Patent [19]
Itoh et al.

[11] Patent Number: 5,223,455
[45] Date of Patent: Jun. 29, 1993

[54] METHOD OF FORMING REFRACTORY METAL FILM

[75] Inventors: Hitoshi Itoh, Mitaka; Takahiko Moriya, Yokohama, both of Japan

[73] Assignee: Kabushiki Kaisha Toshiba, Kawasaki, Japan

[21] Appl. No.: 885,901

[22] Filed: May 18, 1992

Related U.S. Application Data

[63] Continuation of Ser. No. 667,361, Mar. 11, 1991, abandoned, which is a continuation of Ser. No. 127,428, Dec. 2, 1987, abandoned.

[30] Foreign Application Priority Data

Jul. 10, 1987 [JP] Japan .................. 62-171218

[51] Int. Cl.$^5$ .......................................... H01L 21/441
[52] U.S. Cl. .................. 437/192; 437/243; 437/246
[58] Field of Search ............... 437/192, 235, 245, 246, 437/243

[56] References Cited

U.S. PATENT DOCUMENTS

| | | | |
|---|---|---|---|
| 4,501,769 | 2/1985 | Hieber et al. | 437/200 |
| 4,629,635 | 12/1986 | Brors | 427/255.2 |
| 4,684,542 | 8/1987 | Jasinski et al. | 437/245 |
| 4,699,801 | 10/1987 | Ito et al. | 437/235 |
| 5,071,788 | 12/1991 | Joshi | 437/192 |
| 5,108,952 | 4/1992 | Matsuhashi | 437/192 |

FOREIGN PATENT DOCUMENTS

| | | | |
|---|---|---|---|
| 0143652 | 6/1985 | European Pat. Off. | 437/200 |
| 55-71055 | 5/1980 | Japan | 437/200 |
| 0072132 | 4/1984 | Japan . | |
| 59-79550 | 5/1984 | Japan | 437/192 |
| 59-220919 | 12/1984 | Japan | 437/200 |
| 0013051 | 1/1987 | Japan . | |
| 63-133550 | 6/1988 | Japan | 437/200 |

OTHER PUBLICATIONS

Smith, "CVD Tungsten Contact Plugs by in situ Deposition and Etchback", Multilevel Interconnect. Conf., Santa Clara, Calif., Jun. 25–26, 1985.

*Primary Examiner*—John S. Maples
*Attorney, Agent, or Firm*—Foley & Lardner

[57] ABSTRACT

A method for forming a refractory metal film on a substrate utilizes a reduction reaction of the halides of the refractory metal with respect to monosilane, disilane, or the halides of monosilane and disilane to form the refractory metal film while suppressing the reaction by adding a hydrogen gas. As a result, the refractory metal film is formed with good quality at a high speed, or deposited selectively on the nitrides, etc., of metal.

30 Claims, 5 Drawing Sheets

METHOD OF FORMING REFRACTORY METAL FILM

This application is a continuation of application Ser. No. 07/667,361, filed Mar. 11, 1991, now abandoned, which in turn is a continuation of application Ser. No. 07/127,428, filed Dec. 2, 1987, now abandoned.

BACKGROUND OF THE INVENTION

1. Field of the Invention

The present invention relates to a method of manufacturing semiconductor devices, and particularly to a method of forming refractory metal films of high quality at a high speed.

2. Description of the Prior Art

High integration in a semiconductor device can be realized by micronizing its component elements. For instance, a 1M-bit DRAM or a 256K-bit SRAM is presently manufactured based on a design rule of 1 to 1.2 μm. In the future, the design rule of semiconductors will be micronized further to the order of sub-micron.

Such a micronization causes many problems in processing and manufacturing the semiconductor devices. Taking wiring for instance, the width of wiring becomes smaller and the length thereof longer, due to the micronization of design rule. In addition, as the number of active elements in a semiconductor device increases, the number of locations which shall be connected electrically is increased to enlarge the aspect ratio (contact depth/contact width) of each contact hole of the semiconductor device. As a result, wiring using a material of normal Al/1%Si tends to frequently cause problems such as open defects (disconnection of wiring), discontinuity in the bottoms of connection holes, an increase in contact resistance, and electromigration, thereby deteriorating the quality and reliability of wiring.

To solve the problems, there is a demand for new wiring materials and new wiring structures. For instance, to prevent the contact resistance from increasing, a diffusion barrier layer made of refractory metal or a titanium nitride (TiN) film/titanium (Ti) structure is disposed between aluminum (Al) or Al/Si alloy and a silicon (Si) substrate to provide a wiring structure of the refractory metal film. The refractory metal films or their silicide films are thought to be potent as one of new wiring materials. Namely, films made of refractory metals such as tungsten (W), titanium (Ti), molybdenum (Mo), and their silicides are used as diffusion barrier layers of the contacts of semiconductor devices, or as gate electrodes of field-effect transistors (FETs). To form a film from a refractory metal or from its silicide, a high-speed sputtering method is usually adopted. Also, a chemical vapor deposition (CVD) method has been tried for the same purpose. When the CVD method is used to form a thin film under a reduced pressure of several torrs (a reduced-pressure CVD method) a so-called roundabout phenomenon of reactive gas forms a refractory metal film on the bottom of a groove having a large aspect ratio, and a film thickness of the refractory metal formed on the bottom is the same as that of a film formed on a flat portion of the surface of a substrate. Therefore, for the metalization of a VLSI designed according to a fine design rule and having wiring of small pitch and space as well as having narrow contact holes, the reduced-pressure CVD method is a remarkable effective method in forming thin films.

Particularly, a tungsten (W) selective CVD method which forms a tungsten (W) film on only a particular region of a substrate can simplify the processes of semiconductor device manufacturing and produce reliable tungsten films. Therefore, the tungsten selective CVD method has many practical advantages compared to other thin film forming methods.

The tungsten selective CVD method uses a mixed gas made of a halide of tungsten (usually, tungsten hexafluoride ($WF_6$)) and hydrogen ($H_2$ as a source gas to selectively form, according to the CVD method, a tungsten film only on refractory metal such as silicon, aluminum or its alloy, and tungsten, but not on an insulating film such as a silicon oxide film.

Usually, such a tungsten selective CVD method may realize a high-speed deposition to a certain extent, but not provide films of good quality so that, in some cases, the method may not be used in a wiring process.

Further, the tungsten selective CVD method has a limit in temperature at which a stable deposition speed is obtainable. For instance, it will be about 300° C. to 340° C. when the method is performed under a heating lamp in a cold wall type reactive furnace. Generally, it is difficult to strictly maintain the temperature at a constant value because of a wide error range. If the above-mentioned temperature range is not kept, it will be difficult to control the deposition speed.

According to another tungsten selective CVD method which is adopted widely and uses a $WF_6$-$H_2$ system, the deposition of tungsten is always made by the reduction reaction of $WF_6$ with substrate materials such as silicon. The deposition of tungsten causes a so-called "biting" which is a consumption of substrate materials. If the "biting" is caused excessively when tungsten is deposited on a portion of silicon substrate where a diffusion layer is formed, the diffusion layer tends to be destroyed by the "biting". As mentioned, the selective tungsten CVD method using the $WF_6$-$H_2$ system hardly suppresses the consumption of substrate materials with good reproducibility. On the other hand, with the normal CVD method, it is difficult to maintain good selectivity of locations at which thick tungsten films are formed, and a practical high deposition speed.

SUMMARY OF THE INVENTION

An object of the present invention is to provide a chemical vapor deposition method for forming refractory metal films with good quality at selected locations at a high deposition speed.

Another object of the present invention is to provide a selective vapor deposition method of forming refractory metal films having good quality at selected locations at a high deposition speed.

In order to accomplish the objects mentioned in the above, the present invention provides a method of selectively forming a refractory metal film on a predetermined region of a semiconductor substrate in a reactive vessel by a reduction reaction. The method comprises the steps of forming the predetermined region on the substrate; and introducing into the reactive vessel, at least one gas selected in a gas group of the halides of refractory metals such as tungsten, titanium, and tantalum, at least one gas selected in a gas group of monosilane, disilane and the halides of the monosilane and disilane, and a hydrogen gas to selectively deposit the refractory metal on the predetermined region by the reduction reaction.

The above-mentioned step for forming the predetermined region comprises a step of forming on the semiconductor substrate a region of reverse conduction type with respect to the substrate, and a step of forming on the substrate an insulating film having an opening reaching to the reverse conduction type region, in which the predetermined region comprises the reverse conduction type region at the opening. dr

BRIEF DESCRIPTION OF THE DRAWINGS

These and other objects, features and advantages of the present invention will become apparent from the following description of preferred embodiments taken in conjunction with the accompanying drawings in which.

DETAILED DESCRIPTION OF THE EMBODIMENTS

Figure 1A:
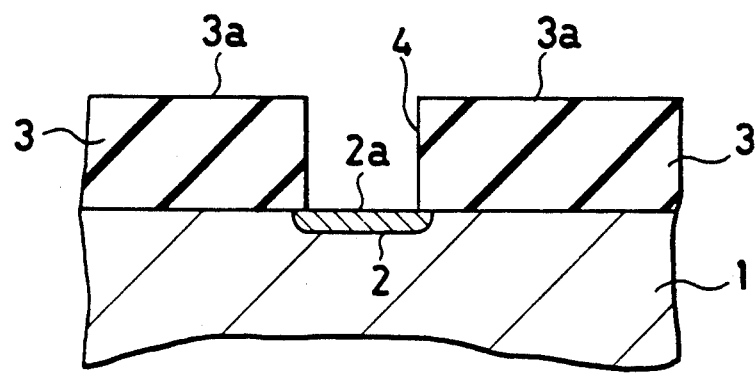
FIGS. 1A and 1B are sectional views showing processes for selectively forming a refractory metal film on a semiconductor substrate according to a first embodiment of the present invention.
Figure 1B:
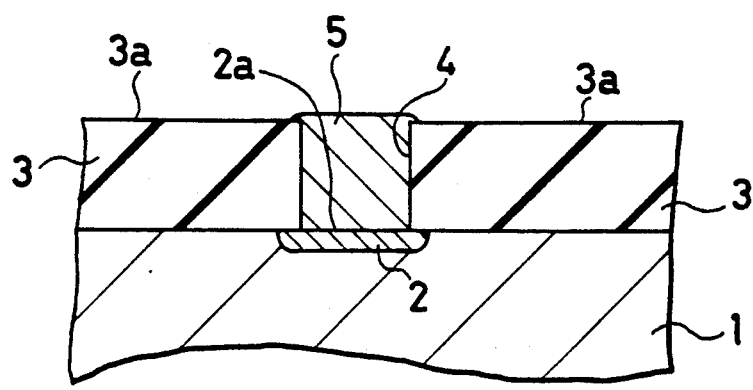

FIGS. 1A and 1B are sectional views showing processes according to the first embodiment of the present invention. A p-type silicon substrate 1 is subjected to an element separation and an arsenic (As) ion implantation, and activated to form an n+ diffusion layer 2 as shown in FIG. 1A. Then, a silicon oxide film 3 is deposited on the substrate 1, and a contact hole 4 is formed by using a normal optical exposure method. Through the contact hole 4, an electrode is connected to the diffusion layer 2. On the surface of the substrate 1, there are an exposed surface portion 2a of the silicon n+ diffusion layer 2 and an exposed surface portion 3a of the silicon oxide film 3.

The substrate 1 is properly processed chemically or physically to clean the silicon surface 2a and the silicon oxide film surface 3a, and then placed in a vacuum CVD furnace of a normal diffusion type. An argon gas of 0 to 2000 cc/min and a hydrogen gas of 200 to 3000 cc/min are introduced into the furnace, and the substrate 1 is heated to a predetermined temperature between 200° C. and 600° C. The flow rate of the hydrogen ($H_2$) gas is properly set according to deposition conditions and stabilized, and a dichlorosilane ($SiH_2Cl_2$) gas of 1 to 200 cc/min is poured onto the substrate 1. At this time and within the above-mentioned temperature range, and dichlorosilane does not dissolve to deposit on the substrate 1.

While the hydrogen and $SiH_2Cl_2$ gases are being poured onto the substrate 1, a $WF_6$ gas of 0.1 to 100 cc/min is added. Then, tungsten 5 selectively deposits on the silicon n+ diffusion layer surface 2a on the bottom of the contact hole 4 at a deposition speed of 100 to 15000 Å/min as shown in FIG. 1B. At this time, the tungsten is not formed on the surface 3a of the silicon oxide film 3, i.e., the selectivity is perfect.

Since the selective deposition of tungsten is realized by the surface reaction of $WF_6$ and $SiH_2Cl_2$, the "biting" of tungsten on the substrate caused by the prior art method using $WF_6$ and $H_2$ is remarkably suppressed so that junction destruction is not caused.

Figure 5:
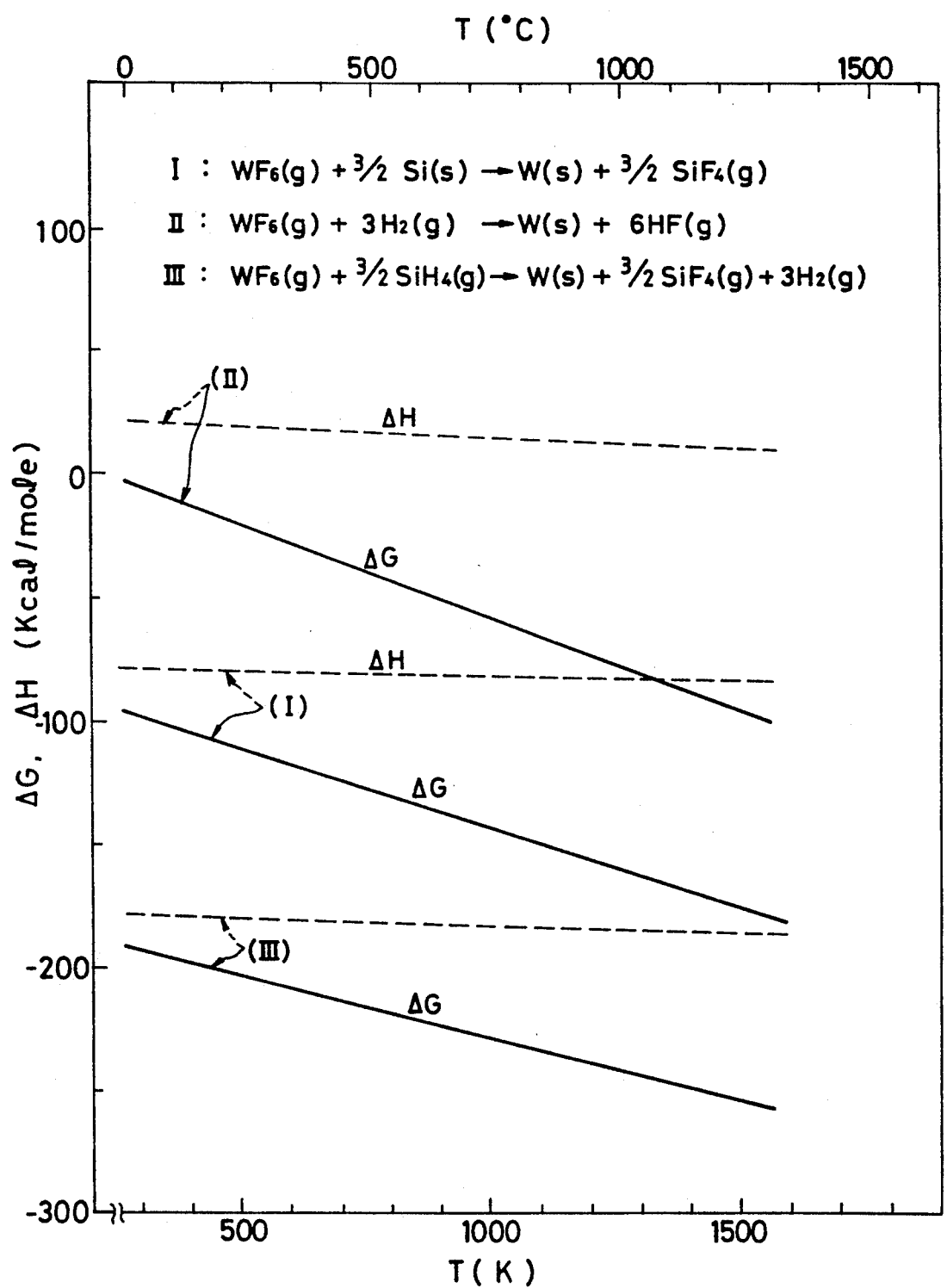
FIG. 5 is a graph showing the relation between changes in free energy and changes in enthalpy in various reactions.

This effect will be described with reference to a graph shown in FIG. 5 where the abscissa represents changes in temperature and an axis of ordinate representing changes in energy. In the graph, "I" represents a free energy change G and an enthalpy change H in a reaction of tungsten and silicon; "II" G and H in a reaction of tungsten and hydrogen; and "III" G and H in a reaction of tungsten and silane. The smaller the free energy change G, the easier it is for the reaction to occur. A value of the free energy change G in the reaction of tungsten and hydrogen "II" is larger than that in the reaction of tungsten and silicon "I". This means that the reaction of tungsten and silicon may occur more easily than that of tungsten and hydrogen, and that the "biting" phenomenon is caused when the mixed gas of $WF_6$ and $H_2$ is used.

The free energy change G in the reaction of tungsten and silane "III" is smaller than that in the reaction of tungsten and silicon. This means that the reaction of tungsten and silane may occur more easily than that of tungsten and silicon, and that the "biting" phenomenon is remarkably suppressed by using the mixed gas of $WF_6$ and $SiH_2$ according to the present invention.

Although dichlorosilane ($SiH_2Cl_2$) has been used in this embodiment, a gas of silane, disilane, or the halides of the silane and disilane may be used instead of the dichlorosilane to provide the same effect.

In comparing (i) introducing an $H_2$ gas as in the case of this embodiment with (ii) introducing an argon (Ar) gas in place of the $H_2$ gas, the case (i) with the $H_2$ gas has a slower deposition speed than the case (ii) with the Ar gas, but the case (i) has a wider temperature range in which a predetermined deposition speed is obtainable as well as realizing a practical good film quality.

As a result of the analysis of selectivity, it has been found that the selectivity depends on a flow rate $Q_1$ of $WF_6$ and a flow rate $Q_2$ of $SiH_2Cl_2$, and that, as the flow rate $Q_1$ is increased, the selectivity increases while a deposition speed of the tungsten film decreases. If the flow rate $Q_2$ is increased, the deposition speed increases while the selectivity is deteriorated to form the tungsten film all over the substrate surface.

The ranges of $Q_1$ and $Q_2$ in which good selectivity is obtainable strongly depend on the temperature, pressure and flow rate ratio.

A flow rate ratio with which a good selectivity can be provided is as follows:

$q_2/Q_1 \leq 3$.

However, when a deposition temperature T rises, the selectivity tends to be deteriorated particular in a central region of the substrate when the ratio is $Q_2/Q_1 > 2$. The selectivity can be maintained sufficiently with a ratio of $Q_2/Q_1 \leq 3$ for a deposition temperature of 250° C. $\leq T \leq 350$° C., and with a ratio of $Q_2/Q_1 \leq 1.5$ for a deposition temperature of 350° C. $\leq T \leq 600$° c. Deposition pressure is also an important factor influencing the selectivity, and good selectivity can be obtained with 0.01 to 5 torrs for the above-mentioned conditions. The lower the deposition pressure, the better the selectivity.

Figure 2A:
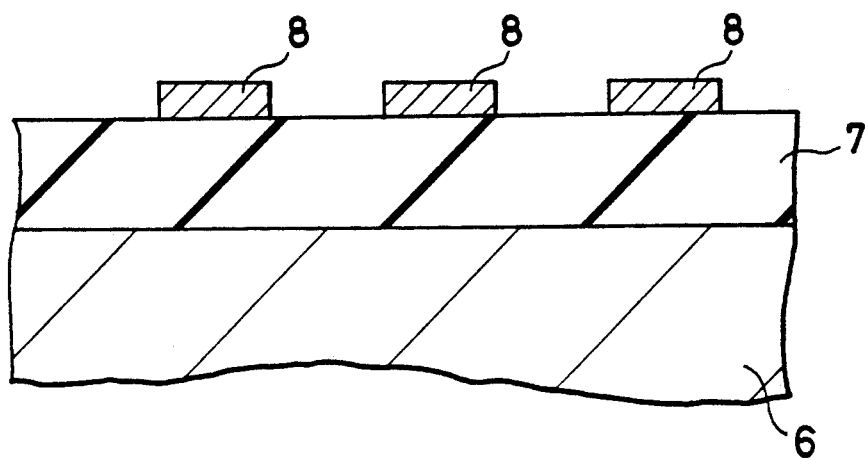
FIGS. 2A and 2B are sectional views showing processes for selectively forming a refractory metal film on a semiconductor substrate according to a second embodiment of the present invention.
Figure 2B:
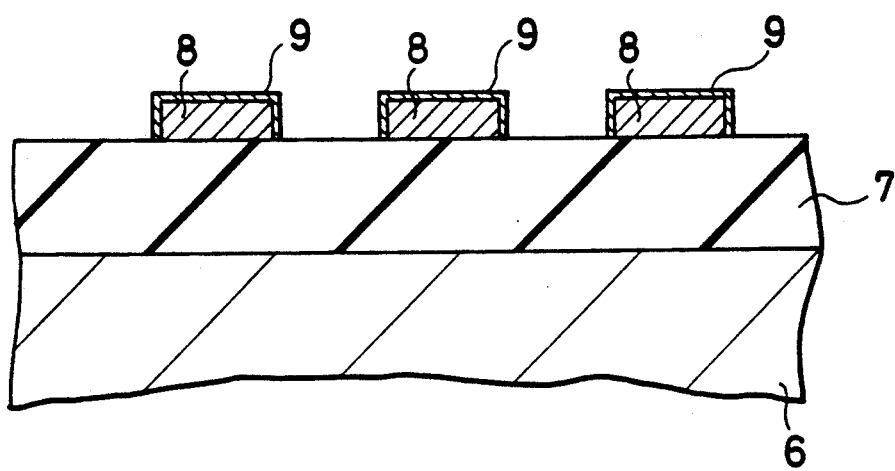

FIGS. 2A and 2B are sectional views showing processes for selectively forming a refractory metal film according to the second embodiment of the present invention. A silicon oxide film 7 with a thickness of 8000 Å is formed on a p-type silicon substrate 6. Then, chemical sputtering is used to form a titanium nitride (TiN) film 8 with a thickness of 1000 Å on the film 7, and the titanium nitride film 8 is subjected to patterning by a normal optical exposure method as shown in FIG. 2A.

Similar to the first embodiment, the substrate is placed in a vacuum CVD furnace of a normal diffusion type. An argon gas of 0 to 2000 cc/min and a hydrogen gas of 200 to 3000 cc/min are poured onto the substrate which is heated to a predetermined temperature between 200° C. to 600° C. Then, the flow rate of the hydrogen gas is properly adjusted according to the deposition conditions and stabilized. A dichlorosilane ($SiH_2Cl_2$) gas of 1 to 1000 cc/min is poured onto the substrate. At this time, within the above-mentioned temperature range, $SiH_2Cl_2$ does not dissolve to deposit on the substrate.

While the hydrogen gas and $SiH_2Cl_2$ gas are being poured onto the substrate, a $WF_6$ gas of 0.1 to 100 cc/min is added. As a result, a tungsten film 9 deposits with a deposition speed of 100 to 2000 Å/min only on the titanium nitride film 8 as shown in FIG. 2B. On the contrary, if a normal mixed gas of $WF_6$ and $H_2$ is used with the above-mentioned deposition conditions, the tungsten film does not deposit on the TiN film 8, or the tungsten film deposits all over the substrate surface but not over the TiN film 8.

The reason of this is considered as follows.

A reaction of $WF_6$ and $H_2$ in the prior art method occurs in a process where the adsorption and dissociation of hydrogen with respect to the substrate tends to govern the reaction. The adsorption and dissociation of hydrogen occurs easily on the surface of a metal such as tungsten (W) while it tends not to occur on the surface of a material which has strong covalent bonding. Therefore, the deposition reaction of tungsten (W) tends not to occur on an oxide film or on a nitride film of metal or silicon. On the other hand, in the reaction of $WF_6$ and $SiH_2Cl_2$ according to the present invention, the adsorption and dissociation of $SiH_2Cl_2$ is larger than that of hydrogen. Further, the dissociation generates Si, H and Cl, and Si greatly contributes to the reduction of $WF_6$ while H and Cl suppress the reaction speed to make the control of the reaction speed easier.

Figure 3A:
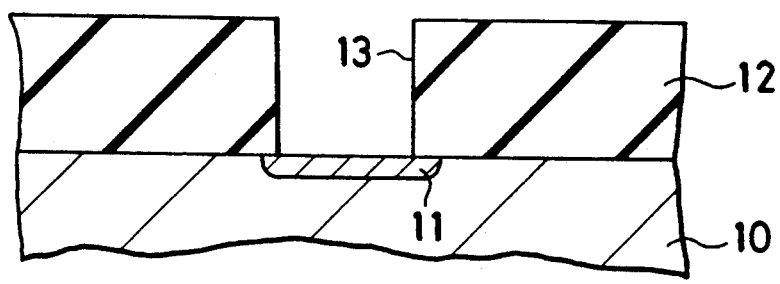
FIGS. 3A to 3D are sectional views showing processes for selectively forming a refractory metal film on a semiconductor substrate according to a third embodiment of the present invention.
Figure 3B:
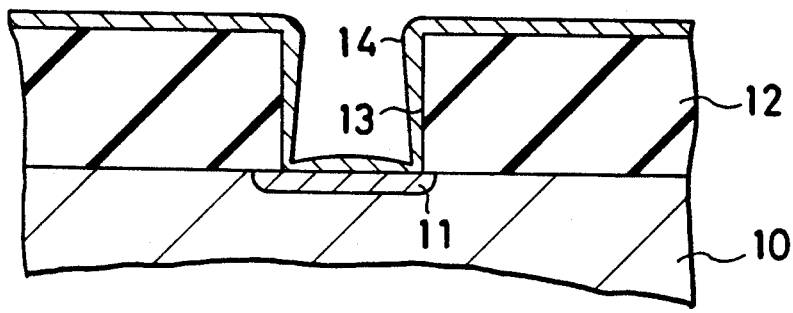
Figure 3C:
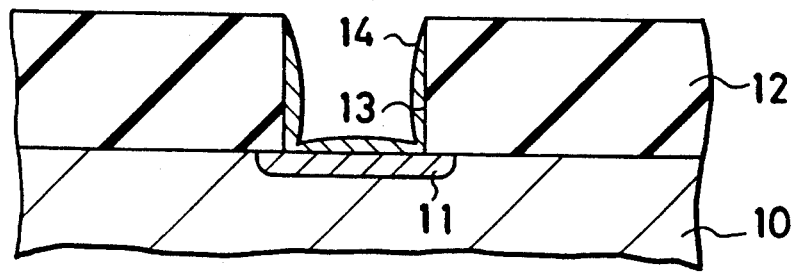
Figure 3D:
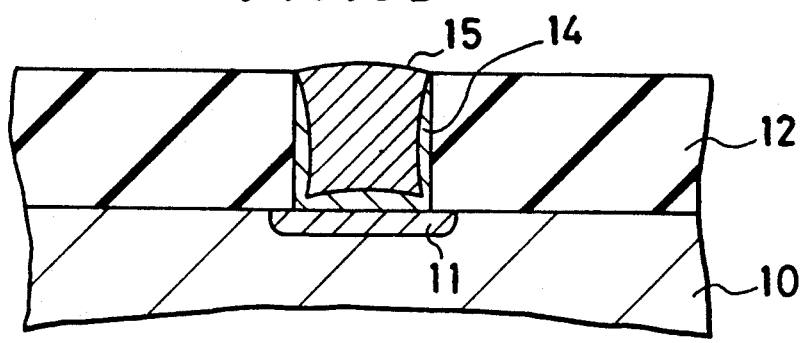

FIGS. 3A and 3D are sectional views showing processes for forming a refractory metal film according to the third embodiment of the present invention. A p-type silicon substrate 10 is subjected to an element separation and an arsenic (As) ion implantation, and activated to form an n+ diffusion layer 11 thereon. After that, a silicon dioxide film 12 is formed on the substrate, and a patterning is carried out by using a normal optical exposure method. The exposed silicon oxide film is etched by a reactive ion sputtering method, etc., to form a contact hole 13 as shown in FIG. 3A The substrate is then subjected to a proper dry processing and a wet processing. By using the reactive sputtering method, etc., a titanium nitride (TiN) film 14 is formed on the contact hole 13 and on the silicon dioxide film 12 as shown in FIG. 3B. Again, the optical exposure method and the reactive sputtering method are used to leave the TiN film 14 on the bottom and side walls of the contact hole 13 as shown in FIG. 3C. The substrate is then placed in a vacuum CVD furnace to selectively deposit tungsten 15 on the TiN as in the second embodiment to fill the contact hole 13 with the tungsten 15 to form a flat substrate surface as shown in FIG. 3D.

Since the selective deposition of tungsten is caused by the surface reaction of $WF_6$ and $SiH_2Cl_2$, the so-called "biting" of the substrate by the tungsten caused when a conventional mixed gas of $WF_6$ and $H_2$ is used is remarkably suppressed so that junction destruction may not result.

Figure 4A:
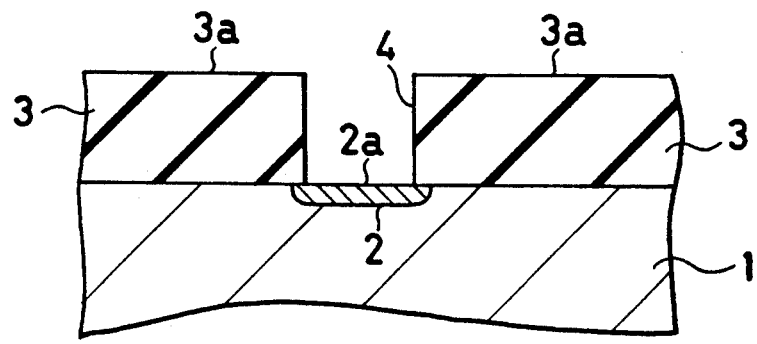
FIGS. 4A to 4C are sectional views showing processes for selectively forming a refractory metal film on a semiconductor substrate according to a fourth embodiment of the present invention.

FIGS. 4A to 4D are views showing processes for selectively forming a refractory metal film according to the fourth embodiment of the present invention. Similar to the first embodiment, a p-type silicon substrate 1 is subjected to an element separation and an arsenic (As) ion implantation, and activated to form an n+ diffusion layer 2 thereon as shown in FIG. 4A. A silicon oxide film 3 is deposited on the substrate, and a contact hole 4 is formed by using a normal optical exposure method. Through the contact hole 4, an electrode is connected to the diffusion layer 2. On the surface of the substrate, there are an exposed surface portion 2a of the n+ silicon diffusion layer 2 and an exposed surface portion 3a of the silicon oxide film 3.

Figure 4B:
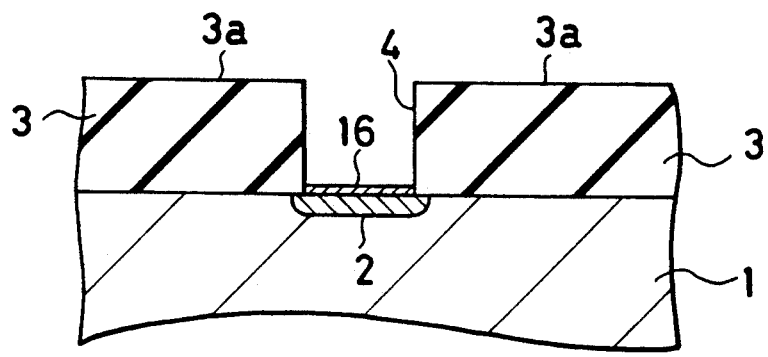

The substrate is chemically or physically processed to clean the silicon surface 2a and the silicon oxide film surface 3a, and placed in a vacuum CVD furnace of a normal diffusion type. A hydrogen gas is poured into the furnace at a flow rate of 200 to 3000 cc/min, and the substrate is heated to a predetermined temperature between 250° C. and 400° C. The flow rate of the hydrogen ($H_2$) gas is properly set according to deposit conditions and stabilized. While the hydrogen gas is being poured onto the substrate, a $WF_6$ gas of 0.5 to 50 cc/min is added at the temperature between 250° C. and 400° C. Then, a tungsten thin film 16 is selectively formed on the silicon surface 2a on the bottom of the contact hole 4 as shown in FIG. 4B.

After that, a hydrogen ($H_2$) gas is poured onto the substrate according to the deposition conditions and stabilized. A dichlorosilane ($SiH_2Cl_2$) gas is then poured onto the substrate at a flow rate of 1 to 200 cc/min.

Figure 4C:
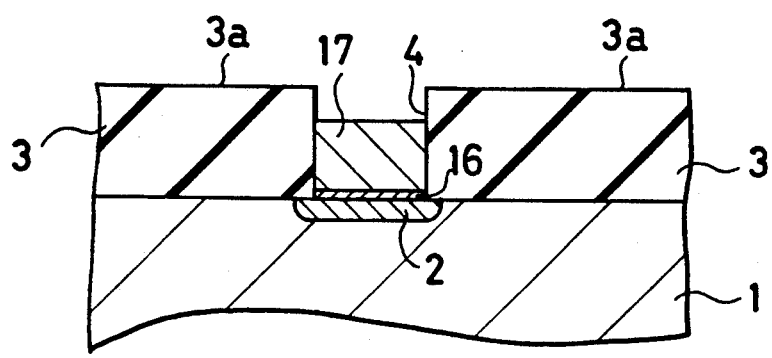

While the hydrogen and $SiH_2Cl_2$ gases are being poured onto the substrate at the temperature between 250° C. and 400° C., a $WF_6$ gas is added at a flow rate of 1 to 100 cc/min. Due to this, as shown in FIG. 4C, tungsten 17 selectively deposits with a deposition speed of 100 to 15000 Å/min on the tungsten thin film 16 in the contact hole 4. At this time, the tungsten does not deposit on the surface 3a of the silicon oxide film 3, i.e., the selectivity is perfect.

The substrate is then heated to a predetermined temperature of 500° C., and a gas comprising $N_2$ and $H_2$ is added at a flow rate of 2 cc/min to perform a heat treatment.

In this fourth embodiment, the mixed gas of $WF_6$ and $H_2$ is used to form the tungsten thin film 16, and the mixed gas of $WF_6$ and $SiH_2Cl_2$ to form the thick tungsten deposition layer 17 on the tungsten thin film 16. Due to the above, the "biting" phenomenon is suppressed and the adhesive force of tungsten with respect to the n+ diffusion layer 2 can be increased. Namely, when the mixed gas of $WF_6$ and $H_2$ is used, the amount of tungsten is sufficiently small to suppress the "biting" phenomenon. In addition, strong adhesive force is generated between the tungsten thin film 16 and the surface 2a of the n+ diffusion layer 2. When the mixed gas of $WF_6$ and $SiH_2Cl_2$ is used, strong adhesive force is generated between the tungsten thin film 16 and the tungsten deposition layer 17.

Although tungsten hexafluoride ($WF_6$) has been used as the halide of a refractory metal in the embodiments, it is possible to use as the refractory metal not only tungsten but also titanium, tantalum and molybdenum. In addition, the chloride of the refractory metal is also effective.

As the halide of monosilane or disilane to be added there are not only $SiH_2Cl_2$ but also $SiCl_4$, $SiH_2F_2$, $SiF_4$, $Si_2H_4Cl_2$, $Si_2H_2Cl_4$, $Si_2Cl_6$, $Si_2H_4F_2$, $Si_2H_2F_4$, and $Si_2F_6$.

The method according to the present invention can be used to form a refractory metal film of about 1000 Å to be used as a barrier metal for the source, drain and gate regions of a MOS transistor. In this case, the refractory metal film can lower the resistance of a contact portion.

In summary, the method for forming a refractory metal film according to the present invention utilizes a reduction reaction of the halide of refractory metal with respect to the halide of monosilane or disilane to form a refractory metal film while suppressing the reaction by adding a hydrogen gas. As a result, the refractory metal film can be formed with good quality at a high speed, or can selectively be deposited on the nitride of a metal.

What is claimed is:

1. A method of forming a tungsten film on only a portion of a semiconductor substrate, comprises the steps of:
   (a) forming said portion on the substrate; and
   (b) introducing first and second gases into a reactive vessel containing the substrate having said portion, the first gas being tungsten hexafluoride having a flow rate $Q_1$ of 100 cc/min or less and the second gas being at least one gas selected from monosilane, disilane, and halides thereof having a flow rate $Q_2$ is 200 cc/min or less, wherein, $R = Q_2/Q_1 \leq 1.5$, the total pressure of all gases P is 5 Torr or less, and a substrate temperature T is between 250° C. and 400° C.

2. The method as claimed in claim 1, wherein said step of forming the said portion comprises the steps of:
   forming in the semiconductor substrate a diffusion layer of opposite conductivity to that of the substrate;
   forming an insulating film on the substrate; and
   opening contact holes through the insulating film on the diffusion layer to form the said portion.

3. The method as claimed in claim 1, wherein said step of forming the said portion comprises the steps of:
   forming a first insulating film on the substrate;
   forming a metallic film for an interconnection of a device on the insulating film;
   forming a second insulating film on the metallic film; and
   opening a through hole through the second insulating film on the metallic film to form the said portion.

4. A method for forming a tungsten film on only a portion of a semiconductor substrate, comprising the steps of:
   (a) forming said portion on the substrate;
   (b) introducing into a reactor vessel containing the substrate having said portion a tungsten hexafluoride gas at a first flow rate $Q_3$;
   (c) introducing into the reactor vessel a tungsten hexafluoride gas at a second flow rate $Q_4$ of 100 cc/min or less, and at least one gas selected from monosilane, disilane and halides thereof at a third flow rate $Q_5$ of 200 cc/min and a flow ratio $R = Q_5/Q_4$ is 1.5 or less.

5. The method as claimed in claim 4, further comprising a step of:
   heating the substrate to carry out a heat treatment of the substrate.

6. The method as claimed in claim 4, wherein $Q_4 > Q_3$.

7. The method as claimed in claim 4, wherein said step for forming the said portion comprises the steps of:
   forming in the semiconductor substrate a diffusion layer of opposite conductivity to that of the substrate;
   forming an insulating film on the substrate; and
   opening contact holes through the insulating film on the diffusion layer to form the said portion.

8. The method as claimed in claim 4, wherein said step for forming the said portion comprises the steps of:
   forming a first insulating film on the substrate;
   forming a metallic wiring film for an interconnection of a device on the insulating film;
   forming a second insulating film on the metallic film; and
   opening a through hole through the second insulating film on the metallic wiring film to form the said portion.

9. The method as claimed in claim 4, wherein the first flow rate of tungsten hexafluoride $Q_3$ is 5 cc/min or less.

10. the method as claimed in claim 5, wherein the substrate temperature for said heat treatment is 500° C.

11. The method as claimed in claim 4, wherein the flow rate of the hydrogen gas is 4000 cc/min or less, and a total pressure of all gases P is 5 Torr or less.

12. A method of forming a refractory metal film comprising tungsten on only a portion of a semiconductor substrate in a reactor vessel by a reduction reaction, comprising the steps of:
   (a) forming said portion on the substrate; and
   (b) introducing into the reactor vessel an introducing quantity $Q_1$ of 100 cc/min or less of at least one gas that is a halide of tungsten, an introducing quantity $Q_2$ of 200 cc/min or less of at least one gas selected from monosilane, disilane, and halides, of monosilane and disilane, to selectively deposit tungsten on the said portion by a reduction reaction at a temperature T between 250° C. and 400° C, wherein $R = Q_2/Q_1 \leq 3$ and the total pressure P of all gases if $0.01 \leq P \leq 5$ (torr).

13. The method as claimed in claim 12, wherein $R \leq 1.5$ when the temperature is greater than or equal to 350° C.

14. The method as claimed in claim 13, wherein said step for forming the said portion comprises the steps of:
   forming in the semiconductor substrate a region of opposite conductivity to that of the substrate; and
   forming on the substrate an insulating film having an opening over the opposite conductivity type region of the said portion.

15. The method as claimed in claim 13, wherein said step for forming the said portion comprises the steps of:
forming an insulating film on the substrate; and
forming a metal wiring on the insulating film, the said portion comprising the surface of the metal wiring.

16. A method for forming a refractory metal film on only a portion of a semiconductor substrate in a reactor vessel by a reduction reaction, comprising the steps of:
(a) forming said portion on the substrate;
(b) introducing into the reactor vessel at least one gas that is a halide of a refractory metal at a first introducing quantity, and hydrogen gas to selectively deposit a refractory metal on the said portion by a reduction reaction; and
(c) introducing into the reactive vessel at least one gas that is a halides of a refractory metal at a second introducing quantity greater than said first introducing quantity, at least one gas selected from monosilane, disilane and halide of monosilane and disilane, to selectively deposit further refractory metal on the already deposited refractory metal by a reduction reaction, wherein the second introducing quantity $Q_1$ of the at least one gas that is a halide of a refractory metal is 1 to 100 cc/min, an introducing quantity $Q_2$ of the at least one gas selected from monosilane, disilane, and the halides of monosilane and disilane is 200 cc/min or below, and a ratio R of the quantities is expressed by $R = q_2/Q_1 < 3$.

17. The method as claimed in claim 16, further comprising a step of:
heating the substrate to carry out a heat treatment of the substrate.

18. The method as claimed in claim 16, wherein the refractory metal is at least one of tungsten, titanium and tantalum.

19. The method as claimed in claim 16, wherein said step for forming said portion comprises the steps of:
forming on the semiconductor substrate a region of opposite conductivity to that of the substrate; and
forming on the substrate an insulating film having an opening reaching to the opposite conductivity region, the said portion comprising the opposite conductivity region located at the opening.

20. The method as claimed in claim 16, wherein said step for forming the said portion comprises the steps of:
forming an insulating film on the substrate; and
forming a metal wiring on the insulating film, the said portion comprising the surface of the metal wiring.

21. The method as claimed in claim 16, wherein the first introducing quantity of the at least one gas that is a halide of a refractory metal is 0.5 to 50 cc/min, and the second introducing quantity is 1 to 100 cc/min.

22. The method as claimed in claim 17, wherein the temperature for said heat treatment is 500° C.

23. The method as claim in claim 16, wherein an introducing quantity of the hydrogen gas is 4000 cc/min or below, and a total pressure P (torr) of the gases is $0.01 \leq P \leq 5$ (torrs).

24. The method as claimed in claim 16, wherein a substrate temperature T at which the refractory metal film is formed by the reduction reaction is between 250° C. and 400° C., and the quantities ratio R is expressed by $R = Q_2/Q_1 \leq 3$ with the proviso that $R \leq 1.5$ when $350° C. \leq T \leq 400° C.$, wherein $Q_1$ represents the second introducing quantity of the at least one gas that is a halide of a refractory metal, $Q_2$ represents an introducing quantity of the at least one gas selected from monosilane, disilane, and the halides of monosilane and disilane, and R represents the ratio of the quantities.

25. A method of forming refractory metal film comprising tungsten, titanium, tantalum or molybdenum on only a portion of a semiconductor substrate in a reactor vessel by a reduction reaction, comprising the steps of:
(a) forming said portion on the substrate; and
(b) introducing into the reactor vessel an introducing quantity $Q_1$ of 0.1 to 100 cc/min of at least one gas that is a halide of a refractory metal, an introducing quantity $Q_2$ of 200 cc/min or less of at least one gas selected from monosilane, disilane, and halides of monosilane and disilane to selectively deposit the refractory metal comprising tungsten, titanium, tantalum or molybdenum on the said portion by a reduction reaction at a temperature T between 250° C. and 400° C., wherein $$R = Q_2/Q_1 \leq 3$$

and the total pressure P of all gases is $0.1 \leq P \leq 5$ (torr).

26. The method as claimed in claim 25, wherein $R \leq 1.5$ when the temperature is greater than or equal to 350° C.

27. The method as claimed in claim 1, wherein the second gas is a halide of monosilane or disilane.

28. The method as claimed in claim 4, wherein a chloride of monosilane or disalane is used in step (c).

29. The method as claimed in claim 12, wherein a chloride of monosilane or disalane is used in step (b).

30. The method as claimed in claim 16, wherein a chloride of monosilane or disalane is used in step (c).

* * * * *